(12) United States Patent
He et al.

(10) Patent No.: US 10,002,887 B2
(45) Date of Patent: Jun. 19, 2018

(54) ARRAY SUBSTRATE, METHOD FOR PRODUCING THE SAME, AND DISPLAY APPARATUS

(71) Applicant: BOE Technology Group Co., Ltd., Beijing (CN)

(72) Inventors: Xiaolong He, Beijing (CN); Yanbing Wu, Beijing (CN); Hong Wang, Beijing (CN); Seong Yeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/324,296

(22) PCT Filed: Mar. 2, 2016

(86) PCT No.: PCT/CN2016/075326
§ 371 (c)(1),
(2) Date: Jan. 6, 2017

(87) PCT Pub. No.: WO2017/036110
PCT Pub. Date: Mar. 9, 2017

(65) Prior Publication Data
US 2017/0207240 A1    Jul. 20, 2017

(30) Foreign Application Priority Data

Sep. 1, 2015    (CN) .......................... 2015 1 0552742

(51) Int. Cl.
*H01L 27/14* (2006.01)
*H01L 27/12* (2006.01)
(Continued)

(52) U.S. Cl.
CPC ............ *H01L 27/124* (2013.01); *H01L 25/18* (2013.01); *G02F 1/1368* (2013.01);
(Continued)

(58) Field of Classification Search
CPC .................................................. H01L 27/1214
(Continued)

(56) References Cited

U.S. PATENT DOCUMENTS 6,008,869 A    12/1999    Oana et al.
7,632,722 B2    12/2009    Park
(Continued)

FOREIGN PATENT DOCUMENTS

CN    1794068 A    6/2006
CN    201886231 U    6/2011
(Continued)

OTHER PUBLICATIONS

First Office Action for Chinese Patent Application No. 201510552742.X, dated Apr. 1, 2017, 10 pages.
(Continued)

*Primary Examiner* — Anthony Ho
(74) *Attorney, Agent, or Firm* — Westman, Champlin & Koehler, P.A.

(57) ABSTRACT

The present disclosure provides an array substrate, a method for producing the same and a display apparatus. The array substrate has a display region and a driving circuit region adjacent to the display region, wherein the display region and the driving circuit region share a same base substrate; the driving circuit region includes a timer control register and/or a system on chip; wherein the timer control register is configured to achieve the timing control of the array substrate, the system on chip being configured to achieve the driving control of the array substrate.

11 Claims, 5 Drawing Sheets

(51) Int. Cl.
*H01L 25/18* (2006.01)
*G09G 3/20* (2006.01)
*G02F 1/1345* (2006.01)
*G02F 1/1368* (2006.01)
*G02F 1/1362* (2006.01)

(52) U.S. Cl.
CPC ...... *G02F 1/13452* (2013.01); *G02F 1/13458* (2013.01); *G02F 1/136227* (2013.01); *G09G 3/2092* (2013.01); *G09G 2310/0264* (2013.01); *G09G 2310/08* (2013.01)

(58) Field of Classification Search
USPC .......................................................... 257/72
See application file for complete search history.

(56) References Cited

U.S. PATENT DOCUMENTS

| | | |
|---|---|---|
| 7,999,267 B2 | 8/2011 | Park |
| 2013/0088265 A1 | 4/2013 | Chen |
| 2016/0019864 A1 | 1/2016 | Li et al. |
| 2017/0287952 A1 | 10/2017 | Li et al. |

FOREIGN PATENT DOCUMENTS

| | | |
|---|---|---|
| CN | 102629444 A | 8/2012 |
| CN | 102998865 A | 3/2013 |
| CN | 103064223 A | 4/2013 |
| CN | 103293727 A | 9/2013 |
| CN | 103676379 A | 3/2014 |
| CN | 103810981 A | 5/2014 |
| CN | 104538408 A | 4/2015 |
| CN | 104749806 A | 7/2015 |
| CN | 105096753 A | 11/2015 |

OTHER PUBLICATIONS

International Search Report and Written Opinion of International Application No. PCT/CN2016/075326, dated Apr. 27, 2016, 11 pages.

English translation of Box No. V of the Written Opinion for the International Searching Authority for International Application No. PCT/CN2016/075326, 2 pages.

Second Office Action from Chinese Patent Application No. 201510552742.X, dated Nov. 16, 2017, 15 pages.

ARRAY SUBSTRATE, METHOD FOR PRODUCING THE SAME, AND DISPLAY APPARATUS

CROSS-REFERENCE TO RELATED APPLICATION

This application is a Section 371 National Stage Application of International Application No. PCT/CN2016/075326, filed on Mar. 2, 2016, entitled "ARRAY SUBSTRATE, METHOD FOR PRODUCING THE SAME, AND DISPLAY APPARATUS", which has not yet published, which claims priority to Chinese Application No. 201510552742.X, filed on Sep. 1, 2015, incorporated herein by reference in their entirety.

BACKGROUND OF THE DISCLOSURE

Field of the Disclosure

The present disclosure relates to a technical field of display, more particularly, to an array substrate, a method for producing the same and a display apparatus.

Description of the Related Art

A flat display is classified into an emission flat panel display such as an organic light emitting display and a plasma display and a non-emission flat panel display such as a liquid crystal display.

The conventional flat panel display typically includes a display panel configured to display an image, a backlight module, a printed circuit board (abbreviated as PCB), and so on. A circuit on the PCB circuit board includes a timer control register (abbreviated as TCON) and a system on chip (abbreviated as SOC). At present, the development of the display panel is focused on the thinning of the display panel. The backlight module may have been attached completely onto the display panel to reduce the thickness. However, the PCB circuit board typically needs to be adhered to a backside (i.e., rear side) or other positions of the display panel by adhesive tapes to occupy a certain space in the module. Furthermore, the panel fabricator needs to purchase the PCB circuit board to assemble the module, thereby further reducing the profit of the products.

SUMMARY

An embodiment of the present application provides an array substrate, wherein the array substrate has a display region and a driving circuit region adjacent to the display region, wherein, the display region and the driving circuit region share a same base substrate;

a timer control register and/or a system on chip are/is positioned in the driving circuit region; wherein the timer control register is configured to achieve the timing control of the array substrate, and the system on chip is configured to achieve the driving control of the array substrate.

In an embodiment, the array substrate includes a thin film transistor, a passivation layer, a resin layer and a common electrode line located in the display region and arranged in sequence on the base substrate;

the array substrate further includes a first metal wiring, a first insulation layer and a second metal wiring located in the driving circuit region and arranged in sequence on the base substrate and a timing control chip and/or a system chip electrically connected to the second metal wiring;

the timer control register comprises the first metal wiring, the second metal wiring and the timing control chip; and/or the system on chip comprises the first metal wiring, the second metal wiring and the system chip; and the first metal wiring and the second metal wiring are configured to transmit signals provided by the timing control chip and/or the system chip to the display region.

In an embodiment, the first metal wiring located in the driving circuit region has a double layer structure; wherein, a gate electrode of the thin film transistor in the display region and a first layer structure of the first metal wiring located in the driving circuit region are arranged in a same layer and made from same material; and a source electrode and a drain electrode of the thin film transistor in the display region and a second layer structure of the first metal wiring located in the driving circuit region are arranged in a same layer and made from same material.

In an embodiment, the first insulation layer located in the driving circuit region has a double layer structure; wherein, the passivation layer in the display region and a first layer structure of the first insulation layer located in the driving circuit region are arranged in a same layer and made from same material; and the resin layer in the display region and a second layer structure of the first insulation layer located in the driving circuit region are arranged in a same layer and made from same material.

In an embodiment, the second metal wiring located in the driving circuit region has a double layer structure; wherein, a common electrode line in the display region and a first layer structure of the second metal wiring located in the driving circuit region are arranged in a same layer and made from same material; and a second layer structure of the second metal wiring located in the driving circuit region is located above the first layer structure of the second metal wiring.

In an embodiment, the array substrate further includes a second insulation layer with via holes located in the driving circuit region and arranged above the second metal wiring; the timing control chip and/or the system chip are/is connected electrically to the second metal wiring through the via holes in the second insulation layer.

An embodiment of the present application also provides a method for producing an array substrate, and the method includes:

providing a base substrate; and producing a display region and a driving circuit region on the base substrate; wherein a timer control register and a system on chip are formed in the driving circuit region, the timer control register being configured to achieve timing control of the array substrate; and/or the system on chip being configured to achieve driving control of the array substrate.

In an embodiment, the step of producing a display region and a driving circuit region on the base substrate includes:

forming a pattern onto the base substrate, the pattern including a thin film transistor, a passivation layer, a resin layer and a common electrode line located in the display region and a first metal wiring, a first insulation layer and a second metal wiring located in the driving circuit region; wherein the first metal wiring and the second metal wiring are configured to transmit signals provided by the timing control chip in the timer control register and/or the system chip in the system on chip to the display region.

In an embodiment, the step of forming a pattern onto the base substrate, the pattern including a thin film transistor located in the display region and a first metal wiring located in the driving circuit region includes:

forming a pattern including a gate electrode of the thin film transistor located in the display region and a first layer structure of the first metal wiring located in the driving circuit region, onto the base substrate through the same one patterning process; and forming a pattern including a source electrode and a drain electrode of the thin film transistor located in the display region and a second layer structure of the first metal wiring located in the driving circuit region, onto the base substrate through the same one patterning process.

In an embodiment, the step of forming a pattern onto the base substrate, the pattern including a passivation layer and a resin layer located in the display region and a first insulation layer located in the driving circuit region includes:

forming a pattern including the passivation layer located in the display region and a first layer structure of the insulation layer located in the driving circuit region, onto the base substrate through the same one patterning process; and forming a pattern including the resin layer located in the display region and a second layer structure of the first insulation layer located in the driving circuit region, onto the base substrate through the same one patterning process.

In an embodiment, the step of forming a pattern onto the base substrate, the pattern including a common electrode line located in the display region and a second metal wiring located in the driving circuit region includes:

forming a pattern including the common electrode line located in the display region and a first layer structure of the second metal wiring located in the driving circuit region, onto the base substrate through the same one patterning process; and forming a pattern of the second layer structure of the second metal wiring located in the driving circuit region onto the first layer structure of the second metal wiring located in the driving circuit region by a patterning process.

In an embodiment, after forming the pattern of the second metal wiring located in the driving circuit region onto the base substrate, the method further includes:

forming a pattern of the second insulation layer with via holes onto the second metal wiring located in the driving circuit region through a patterning process; wherein the timing control chip and/or the system chip are connected electrically to the second metal wiring through the via holes in the second insulation layer.

An embodiment of the present application also provides a display apparatus, wherein the display apparatus includes the array substrate as described above.

DETAILED DESCRIPTION OF PREFERRED EMBODIMENTS OF THE DISCLOSURE

Examples of the array substrate, the method for producing the same and the display apparatus according to embodiments of the present application will be specifically explained below with reference to figures.

In the figures, the thicknesses and shapes of the respective layers are not intended to represent real scales of the array substrate, but intended to illustrate the disclosure in the present application.

Figure 1A:
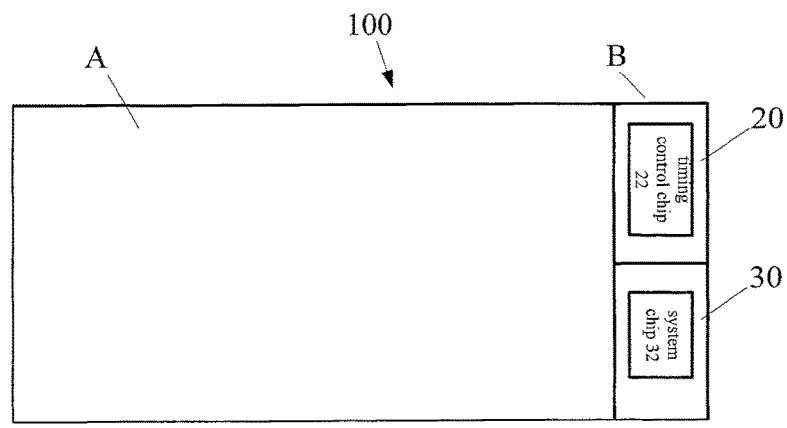
FIG. 1a is a schematic block diagram of an array substrate according to an embodiment of the present application.
Figure 1B:
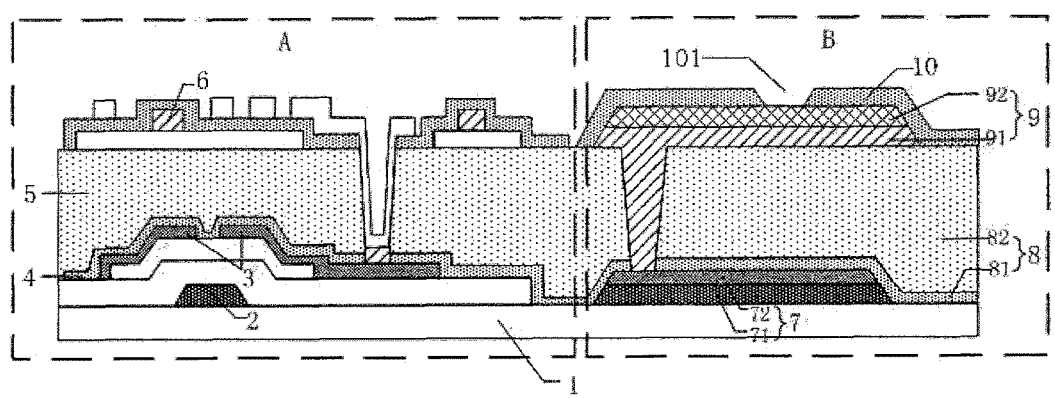
FIG. 1b is a schematic view showing a structure of an array substrate according to an embodiment of the present application.

An embodiment of the present application provides an array substrate. As shown in FIGS. 1a and 1b, the array substrate 100 has a display region A and a driving circuit region B adjacent to the display region A.

The display region A and the driving circuit region B share a same base substrate 1. The driving circuit region B includes a timer control register 20 and/or a system on chip 30. The timer control register 20 is configured to achieve the timing control of the array substrate, and the system on chip 30 is configured to achieve the driving control of the array substrate.

It should be noted that the conventional circuit on the PCB includes the timer control register (TCON) and the system on chip (SOC). However, in the above array substrate according to the embodiment of the present application, the display region and the driving circuit region are formed on the same base substrate and the driving circuit region on the base substrate includes the timer control register and/or system on chip. As a result, the driving circuit region may be considered to replace the PCB in the prior art such that the PCB may be omitted to achieve integration of display and circuit driving. Thus, the array substrate according to the embodiment of the present application is capable of reducing the thickness of the panel and achieving thinning of the module, so that it may be used in transparent display or super thin display. Further, the method for producing the array substrate according to the embodiment of the present application is helpful to save producing time and costs.

In an example, in the above array substrate provided by the embodiment of the present application, as shown in FIG. 1b, the array substrate may include a thin film transistor, a passivation layer 4, a resin layer 5 and a common electrode line 6 located in the display region A and arranged in sequence on the base substrate 1. The array substrate may further include a first metal wiring 7, a first insulation layer 8 and a second metal wiring 9 located in the driving circuit region B and arranged in sequence on the base substrate 1. The array substrate may further include a timing control chip 22 (as shown in FIG. 1a) and/or a system chip 32 (as shown in FIG. 1a) electrically connected to the second metal wiring 9. The first metal wiring, the second metal wiring and the timing control chip may constitute the timer control register 20. The first metal wiring, the second metal wiring and the system chip may constitute the system on chip 30. In this way, all of layers located in the display region A and all of layers located in the driving circuit region B may be produced in the same base substrate 1 to achieve high integration and thinning of the module. The first metal wiring 7 and the second metal wiring 9 in particular are configured to connect the timing control chip or the system chip required for the driving circuit region to form the timer control register or the system on chip, and are configured to transmit signals provided by the timing control chip and/or the system chip to the display region. In an example, the second metal wiring 9 may have a surface used as a pad to form metal holes for welding the pins of electronic devices.

As an example, in the above array substrate provided by the embodiment of the present application, as illustrated in FIG. 1b, the first metal wiring 7 located in the driving circuit region B may be a double layer structure. A gate electrode 2 of the thin film transistor in the display region A and a first layer structure 71 of the first metal wiring 7 located in the driving circuit region B are arranged in a same layer and made from same material. Further, a source electrode and a drain electrode 3 of the thin film transistor in the display region A and a second layer structure 72 of the first metal wiring 7 located in the driving circuit region B may be made from same material. Such design of double layers metal wirings, on one hand, may increase the thickness of a metal film to reduce the resistance of the metal wirings in the driving circuit region (the resistance in the driving circuit region is required to be lower than that in the display region), to improve the producing accuracy and integration. On the other hand, the second layer structure of the first metal wiring may be used to protect the first layer structure so as to prevent the first layer structure from being destroyed during etching process of the second layer structure. And no additional producing processes are needed upon producing the array substrate, but a pattern including the gate electrode and the first layer structure of the first metal wiring may be formed only through the same one patterning process and a pattern including the source electrode and the drain electrode and the second layer structure of the first metal wiring may be formed only through the same one patterning process. In this way, the producing costs may be saved and added value of products may be enhanced.

As an example, in the above array substrate provided by the embodiment of the present application, as illustrated in FIG. 1b, the first insulation layer 8 located in the driving circuit region B may be a double layer structure. The passivation layer 4 in the display region A and a first layer structure 81 of the first insulation layer 8 located in the driving circuit region B may be arranged in a same layer and made from same material. The resin layer 5 in the display region A and a second layer structure 82 of the first insulation layer 8 located in the driving circuit region B may be arranged in a same layer and made from same material. Such design of double layers metal wirings may prevent signal interferences by adding the thickness of film of the insulation layer. And no additional producing processes are needed upon producing the array substrate, but a pattern including the passivation layer and the first layer structure of the first insulation layer may be formed only through the same one patterning process and a pattern including the resin layer and the second layer structure of the first insulation layer may be formed only through the same one patterning process. In this way, the producing costs may be saved and added value of products may be enhanced.

As an example, in the above array substrate provided by the embodiment of the present application, as illustrated in FIG. 1b, the second metal wiring 9 located in the driving circuit region B may be a double layer structure. A common electrode line 6 in the display region A and a first layer structure 91 of the second metal wiring 9 located in the driving circuit region B may be arranged in a same layer and made from same material. A second layer structure 92 of the second metal wiring 9 located in the driving circuit region B is located above the first layer structure 91 of the second metal wiring 9 and it may be produced separately. Such design of double layers metal wirings, on one hand, may increase the thickness of a metal film to reduce the resistance of the metal wirings in the driving circuit region (the resistance in the driving circuit region may be required to be lower than that in the display region), to improve the producing accuracy and integration. On the other hand, the second layer structure of the second metal wiring may be used to protect the first layer structure to prevent the first layer structure from being destroyed during etching process of the second layer structure. And a pattern including the common electrode line and the first layer structure of the second metal wiring may be formed only through the same one patterning process. In this way, the process may be simplified, the producing costs may be saved and added value of products may be enhanced.

As an example, in the above array substrate provided by the embodiment of the present application, as illustrated in FIG. 1b, the array substrate may further include a second insulation layer 10 with via holes 101 located in the driving circuit region B and arranged above the second metal wiring 9. The via holes 101 in the second insulation layer may be used for a pad patterned region for welding the subsequent chips, that is, the timing control chip or the system chip may be connected electrically to the second metal wiring 9 through the via holes 101 in the second insulation layer 10.

As an example, in the above array substrate provided by the embodiment of the present application, the base substrate may further be formed with structures such as a gate insulation layer, an active layer, a common electrode and a pixel electrode thereon. These structures may be done in various ways that are not defined therein.

From the same concept, an embodiment of the present application also provides a method for producing an array substrate as described in the above embodiments of the present application.

In an example, the method for producing an array substrate according to the embodiment of the present application may comprise steps of:

providing a base substrate 1; and producing a display region A and a driving circuit region B on the base substrate 1; wherein the driving circuit region includes: a timer control register 20 configured to achieve timing control of the array substrate; and/or a system on chip 30 configured to achieve driving control of the array substrate.

In the above method for producing the array substrate provided by the embodiment of the present application, both the display region and the driving circuit region are produced on the same base substrate, so that the PCB may be omitted to achieve integration of display and circuit driving, to save producing time and costs, and to reduce the thickness of the panel so as to achieve thinning of the module. It may be used in transparent display or super thin display.

As an example, in the above method for producing the array substrate provided by the embodiment of the present application, the step of producing a display region and a driving circuit region on the base substrate may in particular include:

forming a pattern onto the base substrate 1, the pattern including a thin film transistor, a passivation layer, a resin layer and a common electrode line located in the display region and a first metal wiring, a first insulation layer and a second metal wiring located in the driving circuit region; wherein the first metal wiring and the second metal wiring are configured to transmit signals provided by the timing control chip in the timer control register and/or the system chip in the system on chip to the display region.

Figure 2:
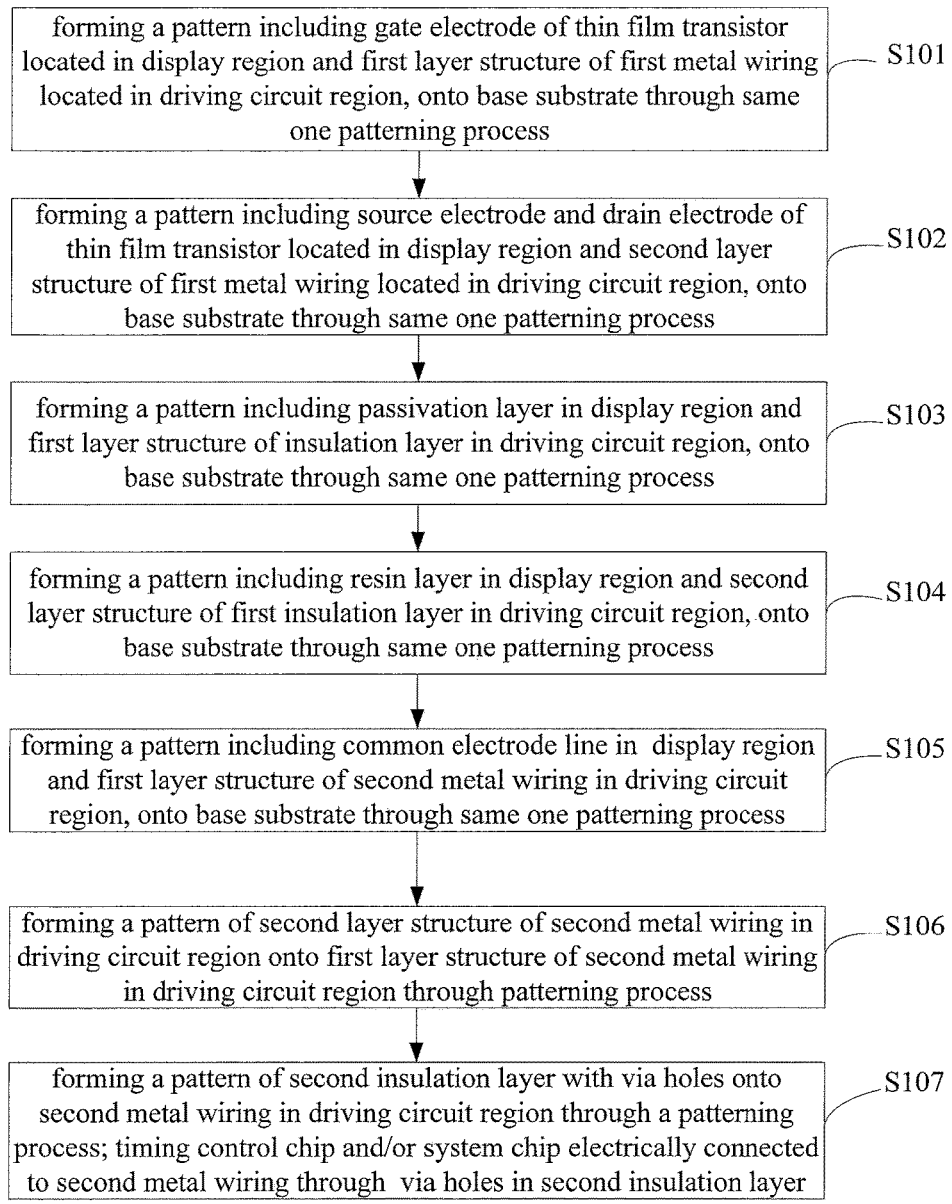
FIG. 2 is a flow chart of a method for producing an array substrate according to an embodiment of the present application.

As an example, in the above method for producing the array substrate provided by the embodiment of the present application, as illustrated in FIG. 2, the step of forming a pattern onto the base substrate 1 is shown, the pattern including a thin film transistor located in the display region A and a first metal wiring 7 located in the driving circuit region B.

In step S101, a pattern including a gate electrode 2 of the thin film transistor located in the display region A and a first layer structure 71 of the first metal wiring 7 located in the driving circuit region B, is formed onto the base substrate 1 through the same one patterning process.

In step S102, a pattern including a source electrode and a drain electrode 3 of the thin film transistor located in the display region A and a second layer structure 72 of the first metal wiring 7 located in the driving circuit region B, is formed onto the base substrate 1 through the same one patterning process.

It should be noted that FIG. 1*b* shows that the gate electrode is located below the active layer and the formed thin film transistor is a bottom gate type structure, however, when the thin film transistor is a top gate type structure, the order of the above steps S101 and S102 may be inversed. The details will be omitted herein.

As an example, in the above method for producing the array substrate provided by the embodiment of the present application, as illustrated in FIG. 2, the step of forming a pattern onto the base substrate 1 is shown, the pattern including a passivation layer 4 and a resin layer 5 located in the display region A and a first insulation layer 8 located in the driving circuit region B.

In step S103, a pattern including the passivation layer 4 located in the display region A and a first layer structure 81 of the insulation layer 8 located in the driving circuit region B, is formed onto the base substrate 1 through the same one patterning process.

In step S104, a pattern including the resin layer 5 located in the display region A and a second layer structure 82 of the first insulation layer 8 located in the driving circuit region B, is formed onto the base substrate 1 through the same one patterning process.

As an example, in the above method for producing the array substrate provided by the embodiment of the present application, as illustrated in FIG. 2, the step of forming a pattern onto the base substrate is shown, the pattern including a common electrode line 6 located in the display region A and a second metal wiring 9 located in the driving circuit region B.

In step S105, a pattern including the common electrode line 6 located in the display region A and a first layer structure 91 of the second metal wiring 9 located in the driving circuit region B, is formed onto the base substrate 1 through the same one patterning process.

In step S106, a pattern of the second layer structure of the second metal wiring located in the driving circuit region is formed onto the first layer structure of the second metal wiring located in the driving circuit region through a patterning process.

As an example, in the above method for producing the array substrate provided by the embodiment of the present application, after the step S106 is performed, the method may further include:

S107. forming a pattern of the second insulation layer with via holes onto the second metal wiring located in the driving circuit region through a patterning process; the timing control chip and/or the system chip being electrically connected to the second metal wiring through the via holes in the second insulation layer.

The method for producing the array substrate according to the embodiment of the present application will be explained in details with reference to a specific example. The specific steps are given as follows.

Figure 3A:
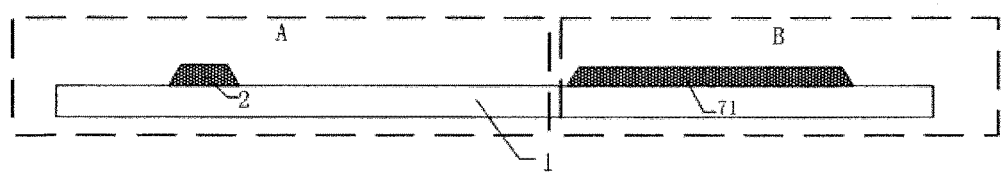
FIGS. 3a to 3i are schematic views showing structures formed after respective steps of the method for producing an array substrate according to an embodiment of the present application, respectively.

In First Step, a pattern including a gate electrode located in the display region and a first layer structure of the first metal wiring located in the driving circuit region, is formed onto the base substrate through the same one patterning process, as shown in FIG. 3*a*.

As an example, a layer of metal thin film is deposited on the same base substrate 1 (such as glass substrate), and then a pattern of the gate electrode 2 is formed in the display region A through the same one patterning process while a pattern of the first layer structure 71 of the first metal wiring 7 is formed in the driving circuit region B.

Figure 3B:
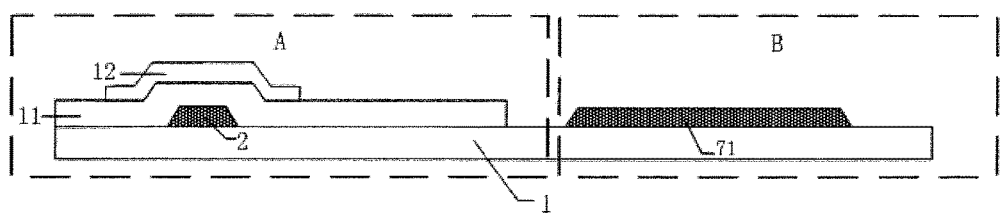

In Second Step, a pattern including a gate insulation layer and an active layer in sequence on the gate electrode located in the display region through a patterning process is formed, as shown in FIG. 3*b*.

As an example, a layer of insulation thin film is deposited on the base substrate 1 after the First Step, and then the pattern of the gate insulation layer 11 is formed in the display region A through a patterning process to etch off the layer of insulation thin film located in the driving circuit region B completely. Then a layer of thin film for the active layer is deposited on the base substrate 1 and a pattern of the active layer 12 is formed in the display region A through one patterning process to etch off the layer of insulation thin film located in the driving circuit region B completely.

Figure 3C:
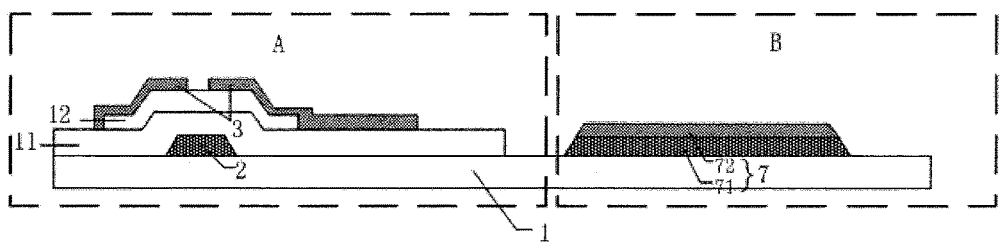

In Third Step, a pattern including a source electrode and a drain electrode located in the display region and a second layer structure of the first metal wiring located in the driving circuit region, is formed onto the base substrate through the same one patterning process, as shown in FIG. 3*c*.

As an example, a layer of metal thin film is deposited on the base substrate 1 after the Second Step is performed, and a pattern of the source electrode and drain electrode 3 is formed in the display region A through the same one patterning process while a pattern of the second layer structure 72 of the first metal wiring 7 is formed in the driving circuit region B.

Figure 3D:
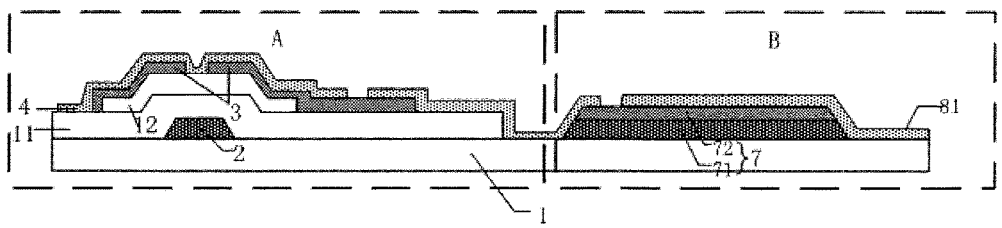

In Fourth Step, a pattern including the passivation layer located in the display region and a first layer structure of the first insulation layer located in the driving circuit region, is formed onto the base substrate through the same one patterning process, as shown in FIG. 3*d*.

As an example, a layer of thin film for the passivation layer is deposited on the base substrate 1 after the Third Step is performed, and the pattern of the passivation layer 4 is formed in the display region A through the same one patterning process while a pattern of the first layer structure 81 of the first insulation layer 8 is formed in the driving circuit region B.

Figure 3E:
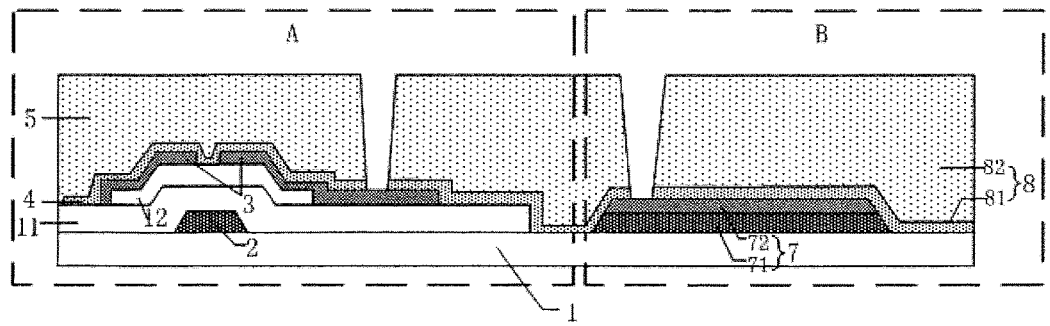

In Fifth Step, a pattern including the resin layer located in the display region and a second layer structure of the first insulation layer located in the driving circuit region, is formed onto the base substrate through the same one patterning process, as shown in FIG. 3*e*.

As an example, a layer of thin film of resin material is deposited on the base substrate 1 after the Fourth Step is performed, and the pattern of the resin layer 5 is formed in the display region A through the same one patterning process while a pattern of the second layer structure 82 of the first insulation layer 8 is formed in the driving circuit region B.

Figure 3F:
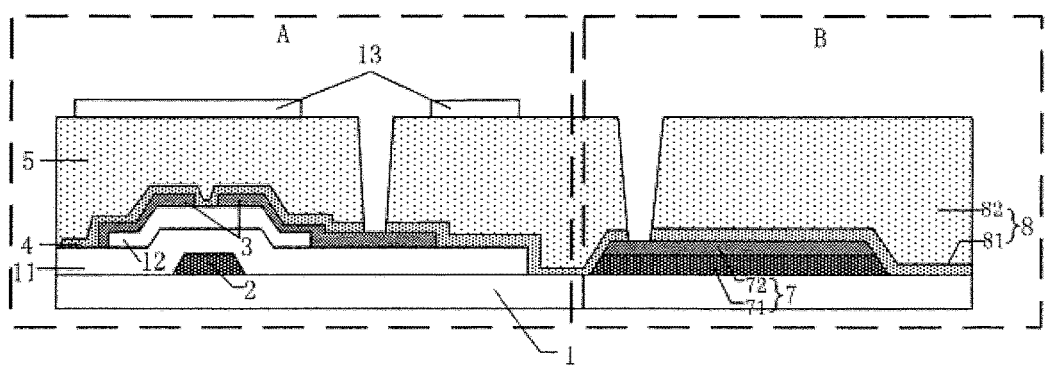

In Sixth Step, a pattern of the common electrode layer is formed onto the resin layer located in the display region through a patterning process, as shown in FIG. 3*f*.

As an example, a transparent conductive layer of thin film is deposited on the base substrate 1 after the Fifth Step is performed, and the pattern of the common electrode layer 13 is formed in the display region A through one patterning process to etch off the transparent conductive layer of thin film located in the driving circuit region B completely.

Figure 3G:
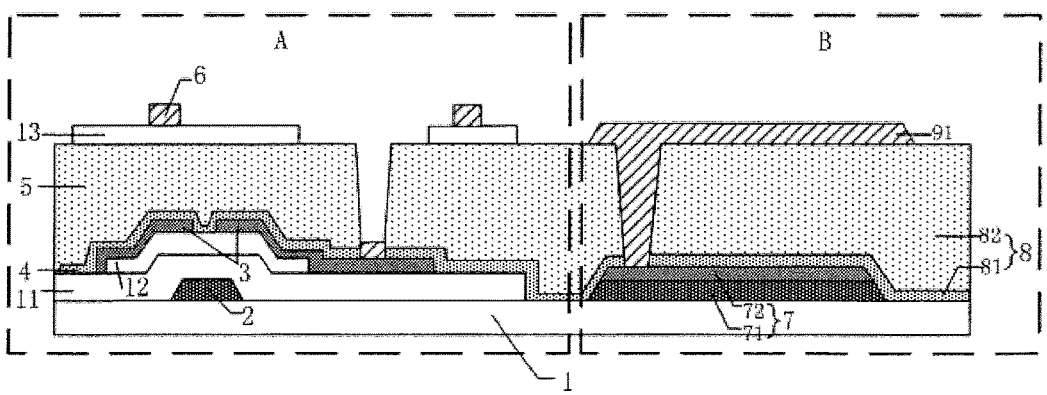

In Seventh Step, a pattern including the common electrode line located in the display region and a first layer structure of the second metal wiring located in the driving circuit region is formed onto the base substrate through the same one patterning process, as shown in FIG. 3g.

As an example, a layer of metal thin film is deposited on the base substrate after the Sixth Step is performed, and the pattern of the common electrode line 6 is formed in the display region A through the same one patterning process while a pattern of the first layer structure 91 of the first metal wiring 9 is formed in the driving circuit region B.

Figure 3H:
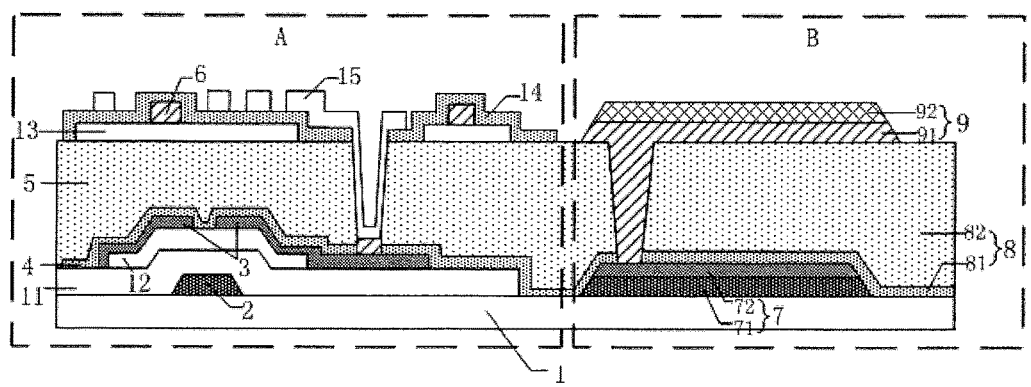

In Eighth Step, a pattern including the second passivation layer, the pixel electrode layer located in the display region and the second layer structure of the second metal wiring located in the driving circuit region is formed onto the base substrate through a patterning process, as shown in FIG. 3h.

As an example, a passivation layer of thin film is deposited on the base substrate 1 after the Seventh Step is performed, and the pattern of the second passivation layer 14 is formed in the display region A through one patterning process to etch off the passivation layer of thin film located in the driving circuit region B completely. Then a layer of metal thin film is deposited on the base substrate 1, and a pattern of the second layer structure 92 of the second metal wiring 9 is formed on the first layer structure 91 of the second metal wiring 9 located in the driving circuit region B to etch off the metal thin film located in the display region A completely. Finally, a transparent conductive layer of thin film is deposited on the base substrate, and a pattern of the pixel electrode layer 15 is formed in the display region A through one patterning process to etch off the transparent conductive layer of thin film located in the driving circuit region B completely.

Figure 3I:
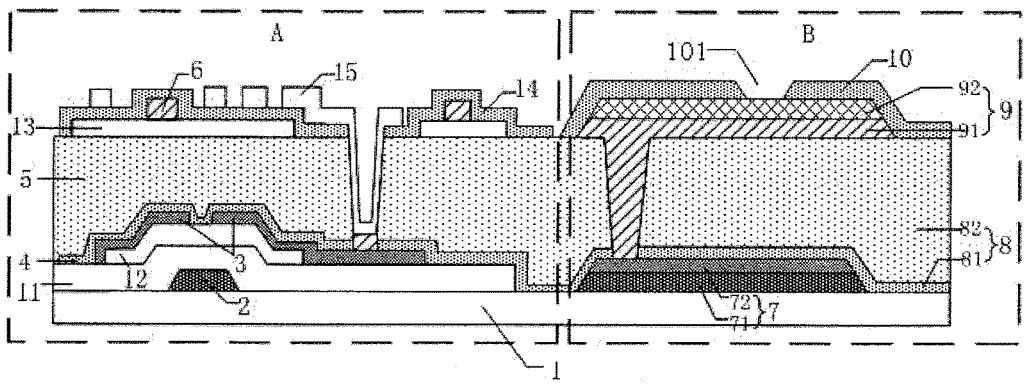

In Ninth Step, a pattern of the second insulation layer with via holes is formed onto the second metal wiring located in the driving circuit region through a patterning process, the timing control chip and/or the system chip being electrically connected to the second metal wiring through the via holes in the second insulation layer, as shown in FIG. 3i.

As an example, a layer of thin film of insulation material is deposited on the base substrate after the Eighth Step is performed, and the pattern of the second insulation layer 10 with via holes 101 is formed on the second layer structure 92 of the second metal wiring 9 located in the driving circuit region B through one patterning process to etch off the thin film of insulation material located in the display region A completely, and the timing control chip or the system chip are electrically connected to the second metal wiring through the via holes 101 in the second insulation layer 10.

Thus, the above array substrate according to the embodiment of the present application may be produced by the above First Step to Ninth Step provided by the above specific example.

From the same concept, an embodiment of the present application also provides a display apparatus including the above array substrate as described in the above embodiment of the present application. The display apparatus may be any products or components having the display function, such as a mobile phone, a tablet computer, TV, a display, a notebook computer, a digital photo frame, or a navigator. The skilled person in the art should understand that the display apparatus has other essential integrate components. The details for these essential integrate components will be omitted herein. The present application is not limited thereto. The implementation of the display apparatus may be known from the above embodiments of the array substrate. The repetitive contents are omitted herein.

Embodiments of the present application provide an array substrate, a method for producing the same and a display apparatus. The array substrate has a display region and a driving circuit region adjacent to the display region. The display region and the driving circuit region share a same base substrate. The driving circuit region includes a timer control register and/or a system on chip, wherein the timer control register is configured to achieve the timing control of the array substrate, and the system on chip is configured to achieve the driving control of the array substrate. The display region and the driving circuit region in the above array substrate provided by the embodiment of the present application are formed on the same base substrate and the driving circuit region on the base substrate includes the timer control register and/or the system on chip. Thus, the driving circuit region may be considered to replace the PCB in the prior art such that the PCB may be omitted to achieve integration of display and circuit driving, to save producing time and costs, and to reduce the thickness of the panel, so as to achieve thinning of the module. It may be used in transparent display or super thin display.

It is apparent to the skilled person in the art to make various modifications and alternations of the present application without departing the spirit and scope of the present application. In this way, if these modifications and alternations of the present application belong to the scope of claims and the equivalent thereof, the prevent application will be intended to include these modifications and alternations.

What is claimed is:

1. An array substrate, wherein the array substrate has a display region and a driving circuit region adjacent to the display region, wherein,
    the display region and the driving circuit region share a same base substrate; and
    a timer control register and/or a system on chip are/is located in the driving circuit region; wherein the timer control register is configured to achieve the timing control of the array substrate, and the system on chip is configured to achieve the driving control of the array substrate;
    wherein the array substrate comprises a thin film transistor, a passivation layer, a resin layer and a common electrode line located in the display region and arranged in sequence on the base substrate;
    the array substrate further comprises a first metal wiring, a first insulation layer and a second metal wiring located in the driving circuit region and arranged in sequence on the base substrate and a timing control chip and/or a system chip electrically connected to the second metal wiring;
    the timer control register comprises the first metal wiring, the second metal wiring and the timing control chip constitute; and/or the system on chip comprises the first metal wiring, the second metal wiring and the system chip; and
    the first metal wiring and the second metal wiring are configured to transmit signals provided by the timing control chip and/or the system chip to the display region; and
    wherein the first metal wiring located in the driving circuit region has a double layer structure; wherein,
    a gate electrode of the thin film transistor in the display region and a first layer structure of the first metal wiring located in the driving circuit region are arranged in a same layer and made from same material; and
    a source electrode and a drain electrode of the thin film transistor in the display region and a second layer structure of the first metal wiring located in the driving circuit region are arranged in a same layer and made from same material.

2. The array substrate according to claim 1, wherein the first insulation layer located in the driving circuit region has a double layer structure; wherein, the passivation layer in the display region and a first layer structure of the first insulation layer located in the driving circuit region are arranged in a same layer and made from same material; and the resin layer in the display region and a second layer structure of the first insulation layer located in the driving circuit region are arranged in a same layer and made from same material.

3. The array substrate according to claim 1, wherein the second metal wiring located in the driving circuit region has a double layer structure; wherein, a common electrode line in the display region and a first layer structure of the second metal wiring located in the driving circuit region are arranged in a same layer and made from same material; and a second layer structure of the second metal wiring located in the driving circuit region is located above the first layer structure of the second metal wiring.

4. The array substrate according to claim 1, wherein the array substrate further comprises a second insulation layer with via holes, the second insulation layer being located in the driving circuit region and arranged above the second metal wiring; and the timing control chip and/or the system chip are/is connected electrically to the second metal wiring through the via holes in the second insulation layer.

5. A display apparatus, wherein the display apparatus comprises the array substrate according to claim 1.

6. The array substrate according to claim 1, wherein the first insulation layer located in the driving circuit region has a double layer structure; wherein, the passivation layer in the display region and a first layer structure of the first insulation layer located in the driving circuit region are arranged in a same layer and made from same material; and the resin layer in the display region and a second layer structure of the first insulation layer located in the driving circuit region are arranged in a same layer and made from same material.

7. The array substrate according to claim 1, wherein the second metal wiring located in the driving circuit region has a double layer structure; wherein, a common electrode line in the display region and a first layer structure of the second metal wiring located in the driving circuit region are arranged in a same layer and made from same material; and a second layer structure of the second metal wiring located in the driving circuit region is located above the first layer structure of the second metal wiring.

8. The array substrate according to claim 2, wherein the second metal wiring located in the driving circuit region has a double layer structure; wherein, a common electrode line in the display region and a first layer structure of the second metal wiring located in the driving circuit region are arranged in a same layer and made from same material; and a second layer structure of the second metal wiring located in the driving circuit region is located above the first layer structure of the second metal wiring.

9. The array substrate according to claim 3, wherein the array substrate further comprises a second insulation layer with via holes, the second insulation layer being located in the driving circuit region and arranged above the second metal wiring; and the timing control chip and/or the system chip are/is connected electrically to the second metal wiring through the via holes in the second insulation layer.

10. A display apparatus, wherein the display apparatus comprises the array substrate according to claim 1.

11. A display apparatus, wherein the display apparatus comprises the array substrate according to claim 1.

* * * * *